United States Patent [19]
Ferguson, Jr. et al.

[11] Patent Number: 6,040,793
[45] Date of Patent: Mar. 21, 2000

[54] SWITCHED-CAPACITOR SIGMA-DELTA ANALOG-TO-DIGITAL CONVERTER WITH INPUT VOLTAGE OVERLOAD PROTECTION

[75] Inventors: Paul F. Ferguson, Jr., N. Andover; James Wilson, Sharon, both of Mass.

[73] Assignee: Analog Devices, Inc., Norwood, Mass.

[21] Appl. No.: 09/040,620

[22] Filed: Mar. 18, 1998

[51] Int. Cl.[7] .............................. H03M 3/00; H03M 1/12
[52] U.S. Cl. .......................... 341/143; 341/172; 327/337
[58] Field of Search .................................. 341/143, 144, 341/150, 172; 327/91, 337; 455/110

[56] References Cited

U.S. PATENT DOCUMENTS

| | | | |
|---|---|---|---|
| 4,851,841 | 7/1989 | Sooch | 341/143 |
| 5,134,401 | 7/1992 | McCartney et al. | 341/143 |
| 5,198,817 | 3/1993 | Walden et al. | 341/143 |
| 5,479,130 | 12/1995 | McCartney | 327/341 |
| 5,563,597 | 10/1996 | McCartney | 341/150 |
| 5,634,202 | 5/1997 | Connell et al. | 455/110 |
| 5,745,060 | 4/1998 | McCartney et al. | 341/143 X |
| 5,872,469 | 2/1999 | Nestler | 327/91 |

*Primary Examiner*—Brian Young
*Assistant Examiner*—Patrick Wamsley
*Attorney, Agent, or Firm*—Wolf, Greenfield & Sacks, P.C.

[57] ABSTRACT

A sigma-delta analog-to-digital converter includes an integrator having an input and an output and an integrator capacitor connected between the input and output. A switched-capacitor input circuit includes at least one input capacitor, an input sampling switching circuit and an input delivery switching circuit. The input sampling switching circuit includes at least one input sampling switch operable to connect the input capacitor to be charged by an input voltage at a sampling rate. The input delivery switching circuit includes at least one input delivery switch operable to connect the input capacitor to transfer charge to the integrator capacitor at a first transfer rate. A switched-capacitor feedback circuit is connected in a feedback path between the input and output of the integrator. The feedback circuit includes at least one feedback capacitor, a feedback sampling switching circuit and a feedback delivery switching circuit. The feedback sampling switching circuit includes at least one feedback sampling switch operable to connect the feedback capacitor to be charged by a feedback reference voltage at the sampling rate. The feedback delivery switching circuit includes at least one feedback delivery switch operable to connect the feedback capacitor to transfer charge to the integrator capacitor at a second transfer rate. The second transfer rate is a predetermined factor greater than the first transfer rate such that the sampled feedback reference voltage charge is transferred to the integrator capacitor at a greater rate than the transfer of the sampled input voltage charge to prevent modulator instability due to an input overload condition.

10 Claims, 2 Drawing Sheets

SWITCHED-CAPACITOR SIGMA-DELTA ANALOG-TO-DIGITAL CONVERTER WITH INPUT VOLTAGE OVERLOAD PROTECTION

FIELD OF THE INVENTION

The present invention relates to sigma-delta analog-to-digital converters ("ADCs") and, more particularly, to switched-capacitor sigma-delta ADCs including input voltage overload protection.

BACKGROUND OF THE INVENTION

Sigma-delta ADCs and digital-to-analog converters ("DACs") have recently come into widespread use with the development of suitable process technology and the increase in digital audio and other applications. Sigma-delta converters utilize oversampling techniques (i.e., sampling at rates greater than the Nyquist rate) to achieve high signal-to-noise ratios. Such converters also exhibit excellent linearity. Additionally, sigma-delta converters are relatively straightforward and inexpensive to implement due to their simplicity.

A sigma-delta ADC converts an analog input voltage to digital output samples at a predetermined rate. A typical sigma-delta ADC includes a front-end modulator which, by performing an oversampling technique referred to as "noise shaping", manipulates the noise spectrum of the analog input signal such that a major component of the quantization noise power is shifted to a frequency range outside of the band of interest, which is typically the signal band width (within the output samples). Subsequent filtering ("decimation") is performed in the digital domain to reduce the out-of-band quantization noise component of the digital output samples.

A conventional, first order low-pass sigma-delta ADC is shown in block diagram form in FIG. 1. The ADC includes a modulator 50 and a decimator 60. Modulator 50 converts an input voltage Vin, received on line 70, into a one-bit data stream X at a rate determined by the sampling frequency $Kf_s$. Modulator 50 performs oversampling and noise shaping on the input voltage. The one-bit data stream X is provided on line 59 to decimator 60 which low-pass filters the data stream to reduce the quantization noise component thereof, and provides filtered output samples at a rate $f_s$ on output line 61. In short, the decimator 50 decimates, by a factor K, the one-bit data stream.

The modulator 50 includes an input circuit 51 which samples the input voltage Vin and provides the sampled input signal to a summing circuit 54. Summing circuit 54 subtracts a feedback signal (described below), received on line 65, from the sampled input signal and provides the output signal difference on line 55 to an integrator 56. Integrator 56 conventionally "integrates" the output signal difference from the summing circuit 55 and provides an output voltage A to a clocked, latched comparator 58. Summing circuit 54 can generally be considered as an input section of the integrator. Comparator 58 conventionally "compares" voltage A to a reference voltage and provides an output X at a rate $Kf_s$ (corresponding to its clock), which output X is the one-bit data stream output of the modulator. Thus, comparator 58 is effectively a one-bit ADC.

Data stream X is also provided on feedback line 63 to a feedback circuit 52, which includes a one-bit DAC. The output X controls a switch 53 within the feedback circuit 52 such that either a positive feedback reference voltage +Vref, received on line 74, or a negative feedback reference voltage −Vref, received on line 76, will be applied, for each bit, via feedback line 65, to the summing circuit 54. This switching operation of the feedback circuit 52 of the modulator 50 is conventional for a closed-loop circuit and should be readily understood by those skilled in the art.

Integrator 50 typically includes an operational amplifier and a feedback connected capacitor (not shown in FIG. 1). The above description of the modulator, in which a single input voltage is sampled (with respect to ground), assumes the use of a single-ended operational amplifier. As will be understood by those skilled in the art, however, the integrator may include a differential amplifier for which positive and negative input voltages are separately sampled.

Switched-capacitor circuits are commonly used to implement the input and feedback circuits for respectively sampling the input and feedback reference voltages. Switched-capacitor circuits include switches and capacitors. During operation, a capacitor is typically charged by a voltage source (i.e., the input voltage or feedback reference voltage source) through a first switch (or switches) during a first time interval (clock phase), and charge is thereafter "transferred" during the closing of a second switch (or switches) from the capacitor during a second, non-overlapping time interval. The switches often include CMOS transistors due to their high performance and yield.

What is described is a first order modulator that does not suffer input overload until Vin>Vref. Sooch applies to higher order modulators as does the present invention.

When the level of the analog input voltage of an ADC modulator applied to the integrator input approaches the level of either the positive feedback reference voltage or the negative feedback reference voltage applied to the integrator input (such a condition is sometimes referred to as "input overload" or "crash"), the noise level in the digital output samples greatly increases. Such a condition is described and addressed, for example, in U.S. Pat. No. 4,851,841 to Sooch. The noise increase occurs during an input overload situation because the modulator output remains in the same state for a relatively long number of clock cycles and, thus, an even longer period of time is needed to stabilize the integrator output and achieve an accurate output. In fact, complete modulator instability may result from an extreme input overload situation. With higher-order modulators (which include a greater number of integrators), the risk of instability increases and the input voltage range over which the modulator remains stable decreases.

"Gain scaling" is an approach aimed at reducing the risk of modulator instability due to the above-described input voltage overload condition. Gain scaling typically involves "ratioing" the value of the input capacitor or resistor (used to sample the input voltage) to the value of the feedback capacitor or resistor (used to sample the feedback reference voltage) such that the charge "transferred" to the integrator capacitor from the feedback capacitor will be greater (by a predetermined factor) than that transferred from the input capacitor. It should be appreciated by those skilled in the art that, as used in the art and herein, charge "transfer" refers to a charging of the integrator capacitor by the integrator output voltage source to compensate for the charging or discharging of the input or feedback capacitors (explained in greater detail hereinafter). Thus, a literal, physical movement of charge may not occur.

The increase in transferred feedback charge appears to the integrator as if the input voltage has been attenuated relative to the feedback—i.e., some dynamic range is lost. The seeming "attenuation" in input voltage is usually compensated for in the digital domain by providing gain (e.g., in an amount to compensate for the attenuation factor). Such a gain scaling technique is described, for example, in the Sooch patent. While the capacitor (or resistor) ratioing approach has generally satisfactory performance, it requires the use of capacitors (or resistors) of different values for sampling the input signal and the feedback signal; this may necessitate pre-operation gain calibration of the modulator.

U.S. Pat. No. 5,134,401 to McCartney, while not expressly aimed at gain scaling, teaches that input voltage gain or attenuation (of a sigma-delta modulator) can be achieved without ratioing the values of the input and feedback capacitors (or resistors). Rather, the modulator of the McCartney patent adjusts the rate of sampling of the input voltage relative to the rate of sampling of the feedback reference voltage to achieve a desired input voltage gain or attenuation. For input voltage attenuation, for example, the McCartney patent teaches to sample the input voltage during only one time clock phase and to sample the feedback reference voltage during both clock phases, thus transferring feedback signal charge at twice the rate of the transfer of input signal charge. While the approach taught in the McCartney patent has generally satisfactory performance, it requires sampling the input signal at a lesser rate than sampling the feedback reference signal to achieve gain scaling.

Accordingly, a general object of the present invention is to provide a high-performance sigma-delta ADC including circuitry for preventing modulator instability due to an input voltage overload condition which avoids the design constraints of the prior art.

SUMMARY OF THE INVENTION

The aforementioned drawbacks of the prior art are overcome by a method and apparatus of the present invention in which a switched-capacitor input circuit charges an input capacitor with an input voltage at a sampling rate and transfers charge from the input capacitor to an integrator capacitor at a first transfer rate, and a switched-capacitor feedback circuit charges a feedback capacitor with a feedback reference voltage at the sampling rate and transfers charge from the feedback capacitor to the integrator capacitor at a second transfer rate, greater than the first transfer rate.

More particularly, according to the invention, an analog-to-digital converter includes an integrator having an input and an output and a capacitor connected between the input and output. A switched-capacitor input circuit includes at least one input capacitor, at least one input sampling switch operable to connect the input capacitor to be charged by an input voltage at a sampling rate, and at least one input transfer switch operable to connect the input capacitor to transfer charge to the integrator capacitor at a first transfer rate. A switched-capacitor feedback circuit is connected in a feedback path between the input and the output of the modulator. The switched-capacitor feedback circuit includes at least one feedback capacitor, at least one feedback sampling switch operable to connect the feedback capacitor to be charged by a feedback reference voltage (of approximate polarity) at approximately the sampling rate, and at least one feedback delivery switch operable to connect the feedback capacitor to transfer charge from the feedback capacitor to the integrator capacitor at a second transfer rate, greater than the first transfer rate.

In accordance with a preferred embodiment of the present invention, the sampled input voltage charge is transferred to the integrator capacitor during either first or second non-overlapping time intervals and the charge developed by the sampled feedback reference voltage is "transferred" to the integrator during both the first and second time intervals.

Also, in accordance with a preferred embodiment of the present invention, the feedback capacitor is charged by a first value of the feedback reference voltage at first sampling times and by a second value of the feedback reference voltage at second sampling times.

Other advantages, novel features and objects of the invention will become apparent from the following detailed description of a preferred embodiment of the present invention when considered in conjunction with the accompanying drawings.

DETAILED DESCRIPTION

By contrast with the prior art modulators in which the input and feedback capacitors are ratioed (i.e., unequal by some factor) or the input voltage is sampled at a different rate than is the feedback reference voltage, the modulator of the present invention preferably (but not necessarily) includes input and feedback capacitors of equal value, and samples the input signal voltage at the same rate as the sampling of the feedback reference voltage. In a preferred embodiment, the feedback reference voltage includes positive feedback reference voltage and a negative feedback reference voltage which are separately sampled. Additionally, the modulator of the present invention transfers the sampled feedback reference charge to the integrator capacitor at a rate greater than that at which the charge on the input sampling capacitor is transferred to the integrator capacitor.

Figure 1:
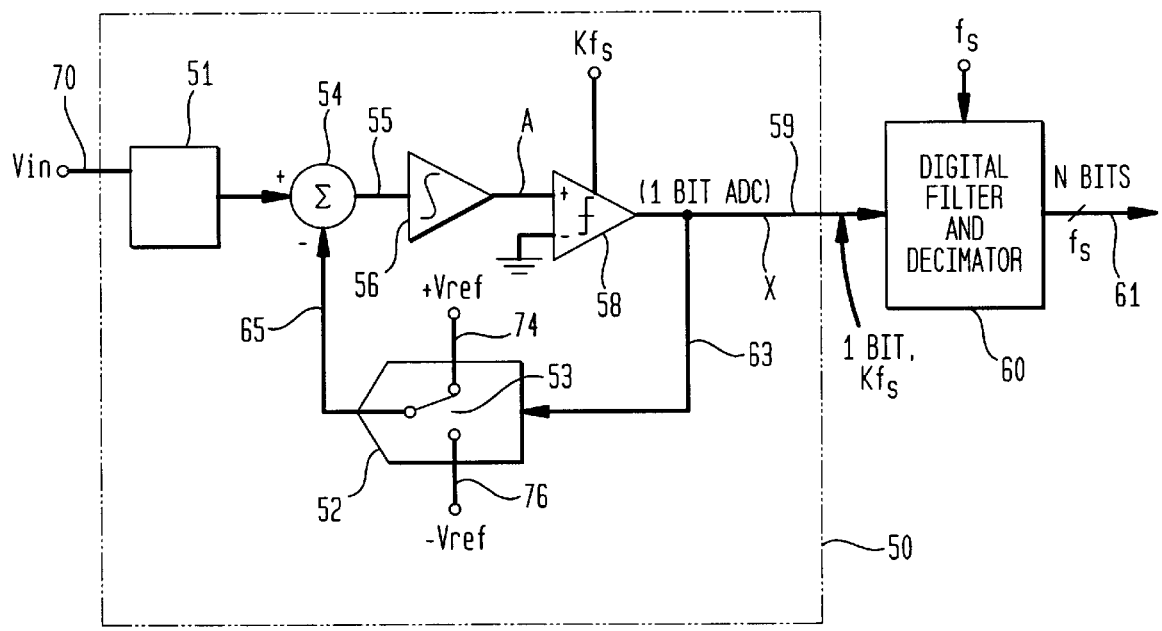
FIG. 1 is a block diagram of a prior art sigma-delta ADC system.
Figure 2:
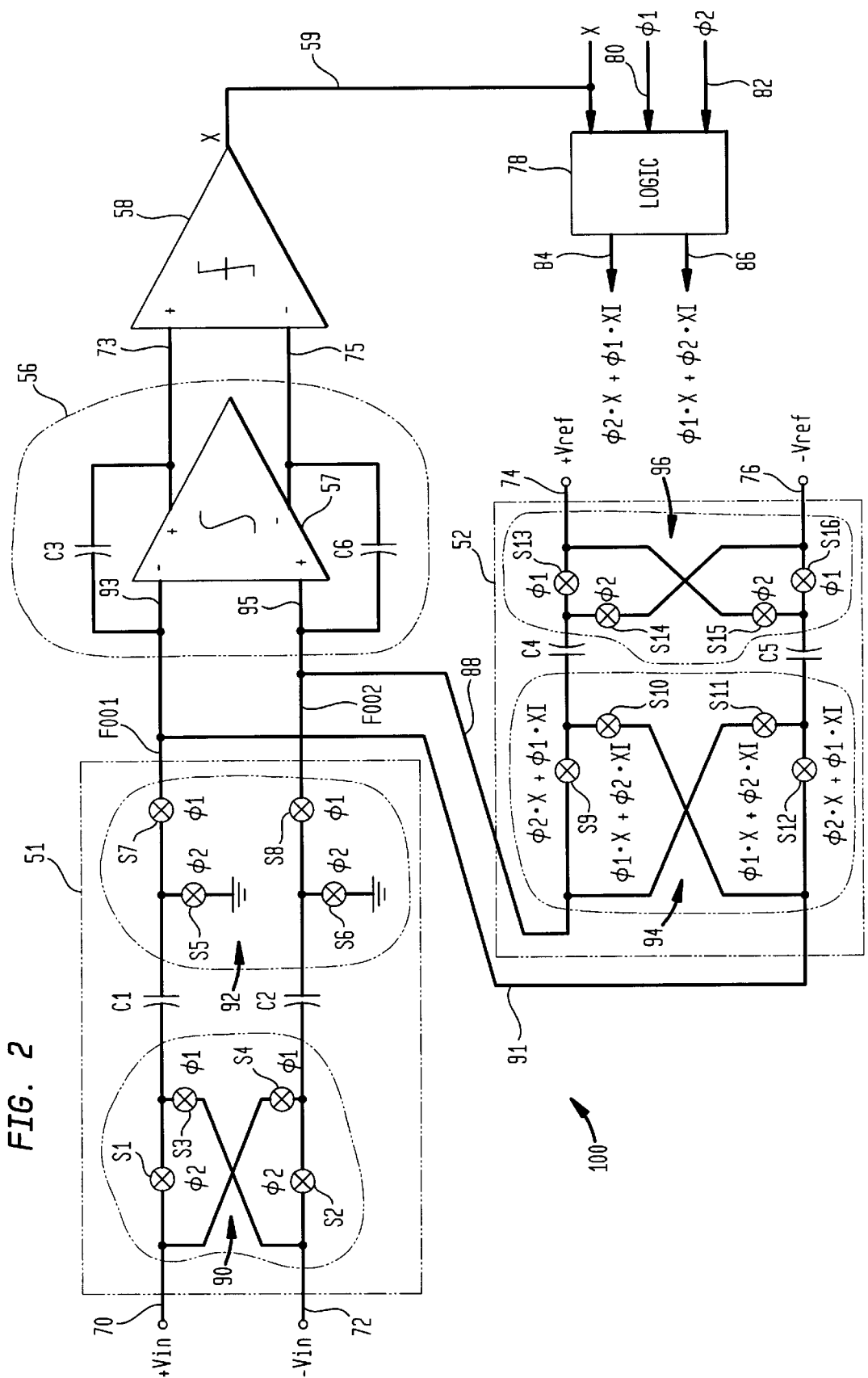
FIG. 2 is a partially-schematic, partially-block diagram of the sigma-delta ADC system according to an embodiment of the present invention.

Referring to FIG. 2, where like elements are referred to by identical reference characters to those of FIG. 1, the modulator 100 of the present invention includes an input circuit 51, an integrator circuit 56, a comparator 58, a digital logic circuit 78, and a feedback circuit 52. Both the input circuit 51 and the feedback circuit 52 are switched-capacitor circuits. During operation, the switched-capacitor input circuit 51 samples the positive input voltage +Vin and the negative input voltage −Vin and then transfers charge to integrator 56. Similarly, switched-capacitor feedback circuit 52 samples the positive feedback reference voltage +Vref and the negative feedback reference voltage −Vref and transfers charge to integrator 56.

Integrator 56 includes an operational amplifier 57, a first integrating capacitor C3 connected between output lead 73 and the inverting input lead of the operational amplifier 93, and a second integrating capacitor C6 connected between output lead 75 and the non-inverting input lead 95. As shown, input line F001 and feedback line 91 are connected to the inverting input lead 93 of operational amplifier 57 and input line F002 and feedback line 88 are connected to the non-inverting input lead 95 of operational amplifier 57. While the operational amplifier is shown as a differential amplifier including two input leads and two output leads, those skilled in the art will appreciate that the integrator 56 may alternatively include a single-ended operational amplifier (as shown in the prior art example of FIG. 1).

The outputs of integrator 56 are provided to the differential inputs of comparator 58 along leads 73 and 75. The output X of comparator 58 is provided along line 59 as an input to digital logic circuit 78 (described below). The outputs of digital logic circuit 78 control operation of certain of the switches within feedback circuit 52 and determine the amount of feedback charge transferred to the integrator capacitors C3 and C6.

The switched-capacitor input circuit 51 includes a first capacitor C1 connected between the input line 70 and output lead F001 and a second capacitor C2 connected between the input line 72 and output lead F002. The switched-capacitor input circuit 51 also includes a first switching circuit 90 and a second switching circuit 92. Capacitors C1 and C2 sample (i.e., are charged by) the positive and negative input voltages through switching circuit 90, and transfer charge to capacitors C3 and C6 through switching circuit 92.

Figure 3:
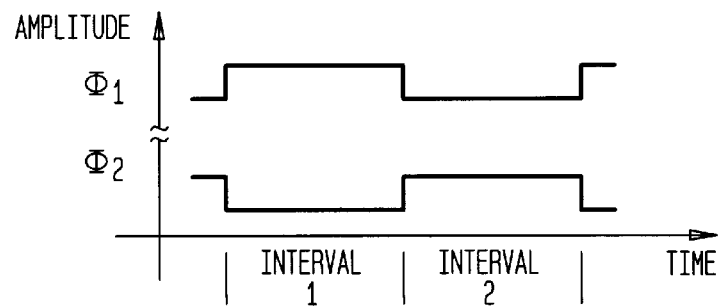
FIG. 3 is a timing diagram of the control signals which control operation of the switches within the ADC system of FIG. 2.

Each of the switching circuits 90 and 92 includes switches labeled with the symbol $\phi 1$ or $\phi 2$. The switches labeled $\phi 1$ are controlled by the control signal $\phi 1$ and the switches labeled $\phi 2$ are controlled by the control signal $\phi 2$. Shown in the timing diagram of FIG. 3 are the control signals $\phi 1$ and $\phi 2$. (Signals $\phi 1$ and $\phi 2$ are shown on the same time axis and the vertical placement of one above the other does not signify that one attains different voltage levels than the other; the "high" and "low" voltage levels of the signals are relative to each other only). As is conventional for a switched-capacitor circuit, the $\phi 1$ and $\phi 2$ switches operate in two non-overlapping time intervals (or clock phases). During interval 1, signal $\phi 1$ is at a "high" voltage level and signal $\phi 2$ is at a "low" voltage level. During interval 2, signal $\phi 1$ is low and signal $\phi 2$ is high. Signal $\phi 1$ controls the switches labeled $\phi 1$ such that during interval 1 (when $\phi 1$ is high), the $\phi 1$ labeled switches are closed (and conduct current) and, during interval 2 (when $\phi 1$ is low), the $\phi 1$ labeled switches are open (and prevent the flow of current). Conversely, the switches labeled $\phi 2$ are open during interval 1 and are closed during interval 2. It is important that the signals $\phi 1$ and $\phi 2$ are not high at the same time so that accurate input voltage and reference voltage sampling occurs. Thus, as will be understood by those skilled in the art, the circuit generating $\phi 1$ and $\phi 2$ (not shown) typically established a "break-before-make" operation whereby the control signals are not simultaneously high.

Referring back to FIG. 2, switching circuit 90 includes a first switch S1 connected between input line 70 and the left plate of capacitor C1, a second switch S2 connected between input line 72 and the left plate of capacitor C2, a third switch S3 connected between the left plate of capacitor C1 and input line 72, and a fourth switch S4 connected between the left plate of capacitor C2 and input line 70. Switching circuit 92 includes a first switch S5 connected between the right plate of capacitor C1 and ground, a second switch S6 connected between the right plate of capacitor C2 and ground, a third switch S7 connected between the right plate of capacitor C1 and inverting input lead 93, and a fourth switch S8 connected between the right plate of capacitor C2 and non-inverting input lead 95. As labeled, switches S3, S4, S7 and S8 are controlled by control signal $\phi 1$, and switches S1, S2, S5 and S6 are controlled by control signal $\phi 2$.

Input circuit 51 operates to sample the input voltages during both time intervals and to transfer charge during only one of the time intervals, as described below. During interval 2, the left plate of capacitor C1 is connected through switch S1 to input line 70 and the right plate of capacitor C1 is connected through switch S5 to ground. Thus, capacitor C1 is charged by the positive input voltage +Vin. Similarly, during interval 2, the left plate of capacitor C2 is connected through switch S2 to input line 72 and the right plate of capacitor C2 is connected through switch S6 to ground. Thus, capacitor C2 is charged by the negative input voltage −Vin.

During interval 1 (following the previous interval 2), the left plate of capacitor C1 is connected through switch S3 to input line 72 and the right plate of capacitor C1 is connected through switch S7 to inverting input lead 93. Thus, capacitor C1 is further charged by the negative input voltage −Vin and charge corresponding to the total voltage on C1, +Vin−(−Vin), is transferred to capacitor C3. As will be understood by those skilled in the art, when switches S3 and S7 close, the integrator output voltage on lead 73 changes to change the charge on capacitor C3 by an amount equal to the charge on capacitor C1. Current flows from output lead 73 through capacitor C3, node N1, switch S7, capacitor C1 and switch S3 to input line 72. Such action occurs due to the equipotential surface between the left plate of capacitor C3 and the right plate of capacitor C1.

Similarly, during interval 1, the left plate of capacitor C2 is connected through switch S4 to input line 70 and the right plate of capacitor C2 is connected through switch S8 to non-inverting input lead 95. Thus, capacitor C2 is further charged by positive input voltage +Vin and charge corresponding to the total voltage of C2, −Vin−(+Vin), is transferred to capacitor C6. Overall, input circuit 51 operates to sample the input voltages during both time intervals and to transfer charge only during interval 1.

Feedback circuit 52 includes a capacitor C4 connected between the positive feedback reference voltage line 74 and non-inverting input lead 95, and a capacitor C5 connected between the negative feedback reference voltage line 76 and inverting input lead 93. Feedback circuit 52 also includes switching circuit 94 and switching circuit 96. Capacitors C4 and C5 sample the positive and negative feedback reference voltages, +Vref and −Vref, through switching circuit 96, and transfer charge to integrator capacitors C3 and C6 through switching circuit 94. Both the sampling of the feedback reference voltages and the transfer of charge occur during both time intervals.

Switching circuit 96 includes a first switch S13 connected between line 74 and right plate of capacitor C4, a second switch S14 connected between right plate of capacitor C4 and line 76, a third switch S15 connected between the right plate of capacitor C5 and line 74, and a fourth switch S16 connected between line 76 and right plate of capacitor C5. As labeled, switches S13 and S16 are controlled by control signal $\phi 1$ and switches S14 and S15 are controlled by control signal $\phi 2$.

During interval 1, the right plate of capacitor C4 is connected through switch S13 to line 74 and the right plate of capacitor C5 is connected through switch S16 to line 76. Thus, capacitors C4 and C5 are charged by the positive feedback reference voltage +Vref and the negative feedback reference voltage −Vref, respectively. During interval 2, the right plate of capacitor C4 is connected through switch S14 to line 76 and the right plate of capacitor C5 is connected through switch S15 to line 74. Thus, capacitors C4 and C5 are further charged by the negative feedback reference voltage −Vref and the positive feedback reference voltage +Vref, respectively. Thus, the feedback reference voltages (taken collectively) are sampled during both time intervals.

Switching circuit 94 includes a first switch S9 connected between the left plate of capacitor C4 and non-inverting input lead 95, a second switch S10 connected between the left plate of capacitor C4 and inverting input lead 93, a third switch S11 connected between the left plate of capacitor C5 and non-inverting input lead 95, and a fourth switch S12 connected between the left plate of capacitor C5 and inverting input lead 93. The switches S9, S10, S11 and S12 of switching circuit 94 are controlled by data-dependent control signals. In particular, switches S9 and S12 are controlled by a first control signal $\phi2 \cdot X + \phi1 \cdot XI$, and switches S10 and S11 are controlled by a second control signal $\phi1 \cdot X + \phi2 \cdot XI$, where signal X is the one-bit data stream output of comparator 58, signal XI is the inverse of signal X, "·" represents a logical AND operation, and "+" represents a logical OR operation.

The control signals $\phi1 \cdot X + \phi2 \cdot XI$ and $\phi2 \cdot X + \phi1 \cdot XI$ are generated by digital logic unit 78 and are provided on the output lines 86 and 84 respectively to the appropriate switches. Digital logic unit 78 receives on input lines 59, 80 and 82, the signals X, $\phi1$ and $\phi2$, respectively. The construction of appropriate digital logic circuitry for the logic unit 78 is within the ability to those skilled in the art and is, therefore, not shown or described herein.

The data-dependent switching of switches S9, S10, S11 and S12 within switching circuit 94 enables the transfer of charge to the integrator during both the first and second time intervals. In other words, the data-dependent switching which occurs ensures that each of the switches S9 and S11 is closed during one of the two time intervals (but not during the same interval), and each of the switches S10 and S12 is closed during one of the two time intervals (but not the same interval), regardless of the state of the input data (signal X). Switch S9, when closed, connects the left plate of capacitor C4 non-inverting input lead 95; switch S10, when closed, connects the left plate of capacitor C4 to inverting input lead 93; switch S11, when closed, connects the left plate of capacitor C5 to non-inverting input lead 95; and switch S12, when closed, connects the left plate of capacitor C5 to inverting input lead 93.

The modulator of the present invention transfers the sampled feedback reference signal charge packets to the integrator at a greater rate (preferably twice) than the transfer of the sampled input signal charge packets. Accordingly, modulator instability due to an input overload condition is avoided. By contrast with the prior art, the modulator of the present invention samples the input voltages at the same rate as the sampling of the feedback reference voltages. Also, in contrast with the prior art, capacitor "ratioing" is not necessary. In fact, it is preferable (though not required) that the values of capacitors C1, C2, C4 and C5 are equal. The use of equal-valued capacitors in the input and feedback circuits ensures accurate gain performance of the modulator, eliminating the requirement for pre-operation gain calibration.

While it has been shown and described that the sampled feedback reference voltage charge packets are transferred to the integrator capacitors at twice the rate of the transfer of the sampled input voltage charge packets, it is envisioned that the switching arrangement could be altered, or the control signals which control the switches could be changed, such that the sampled feedback reference signal charge packets are transferred to the integrator capacitors at a rate greater, by any appropriate predetermined factor, than the transfer of the sampled input signal charge packets.

Additionally, while the modulator shown and described is a first order, one-bit modulator, those skilled in the art will appreciate that the switched-capacitor input and feedback circuits of the present invention could be used with any higher order, multi-bit modulator.

Further, while the embodiment shown and described includes charging one of the input capacitors first by the positive input voltage signal and then by the negative input voltage signal before transferring the charge, the modulator could alternatively first charge the input capacitor by the positive input voltage signal and transfer that charge, and then charge the input capacitor by the negative input voltage signal and transfer that charge.

While there have been shown and described what are at present considered the preferred embodiments of the present invention, which have been disclosed by way of example only, it should be obvious to those skilled in the art that various changes and modifications can be made therein without departing from the spirit and scope of the invention as presented above and as defined by the appended claims and equivalents thereto.

What is claimed:

1. An analog-to-digital converter comprising:
    an integrator having an input and an output;
    a switched-capacitor input circuit having an input capacitor, the input circuit connectable to the input of the integrator, for charging the input capacitor by an input voltage during each of first and second non-overlapping time intervals and for transferring charge from the input capacitor to the integrator during only one of the first and second time intervals; and
    a switched-capacitor feedback circuit having a feedback capacitor, said feedback circuit connected in a feedback path between the input and output of the integrator, for charging the feedback capacitor by a feedback reference voltage during each of the first and second time intervals and for transferring charge from the feedback capacitor to the integrator during each of the first and second time intervals.

2. An analog-to-digital converter as claimed in claim 1 wherein a clock period equalling the first and second time intervals remains constant.

3. An analog-to-digital converter as claimed in claim 1 wherein the feedback capacitor is charged by a first value of the feedback reference voltage at first sampling times and is charged by a second value of the feedback reference voltage at second sampling times.

4. An analog-to-digital converter comprising:
    an integrator having an input and an output and an integrator capacitor connected between the input and output;
    a switched-capacitor input circuit including at least one input capacitor, at least one input sampling switch operable to connect the input capacitor to be charged by an input voltage during each of first and second non-overlapping time intervals, and at least one input transfer switch operable to connect the input capacitor to transfer charge to the integrator capacitor during one of the first and second time intervals; and
    a switched-capacitor feedback circuit, connected in a feedback path between the input and the output of the integrator, including at least one feedback capacitor, at least one feedback sampling switch operable to connect the feedback capacitor to be charged by a feedback reference voltage during each of the first and second time intervals, and at least one feedback transfer switch operable to connect the feedback capacitor to transfer charge to the integrator capacitor during each of the first and second time intervals.

5. An analog-to-digital converter as claimed in claim 4 wherein a clock period equalling the first and second time intervals remains constant.

6. An analog-to-digital converter as claimed in claim 4 wherein the feedback capacitor is charged by a first value of the feedback reference voltage at first sampling times and is charged by a second value of the feedback reference voltage at second sampling times.

7. A method for converting an analog input signal to digital output samples comprising the steps of:

charging an input capacitor by the input signal during each of first and second non-overlapping time intervals;

transferring charge from the input capacitor to an integrator capacitor during one of the first and second time intervals;

charging a feedback capacitor by a feedback reference voltage during each of the first and second time intervals; and transferring charge from the feedback capacitor to the integrator capacitor during each of the first and second time intervals.

8. A method as claimed in claim 7 further including a step of maintaining constant a period equalling the first and second time intervals.

9. A method as claimed in claim 7 wherein the step of charging the feedback capacitor includes the steps of charging the feedback capacitor by a first value of the feedback reference voltage at first sampling times and charging the feedback capacitor by a second value of the feedback reference voltage at second sampling times.

10. An analog-to-digital converter comprising:

an integrator having an input and an output;

a switched-capacitor input circuit including at least one input capacitor, the input capacitor to be charged by an input voltage during at least one of a plurality of time intervals, and to transfer charge to the integrator during not all of the plurality of intervals; and a switched-capacitor feedback circuit, connected in a feedback path between the input and the output of the integrator, including at least one feedback capacitor, to be charged by a feedback reference voltage during at least one of the plurality of intervals and to transfer charge to the integrator during each of the plurality of intervals.

* * * * *